United States Patent [19]

Da Silva et al.

[11] Patent Number: 5,028,786
[45] Date of Patent: Jul. 2, 1991

[54] ARRAY FOR A NUCLEAR RADIATION AND PARTICLE DETECTOR

[75] Inventors: Angela J. Da Silva; Mark A. Le Gros; Brian G. Turrell, all of Vancouver, Canada; Andrzej Kotlicki, Warsaw, Poland; Andrzej K. Drukier, Greenbelt, Md.

[73] Assignee: The University of British Columbia, Canada

[21] Appl. No.: 347,017

[22] Filed: May 4, 1989

[51] Int. Cl.$^5$ .......................................... H01L 39/00
[52] U.S. Cl. ................................. 250/336.2; 505/849
[58] Field of Search .................... 250/336.2; 505/848, 505/849, 917, 840

[56] References Cited

U.S. PATENT DOCUMENTS 4,135,091  1/1979  Lanza et al. ..................... 250/336.2
4,484,074  11/1984  Eder ................................. 250/336.1

FOREIGN PATENT DOCUMENTS 0102398  3/1984  European Pat. Off. ......... 250/336.2

OTHER PUBLICATIONS

M. Le Gros, A. Da Silva, B. G. Turrell, A. Kotlicki and A. K. Drukier, "Planar Array of Superheated Superconductors: An Improved Superheated Superconducting Granule Detector", *Applied Physics Letters*, vol. 56, No. 22 (May 28, 1990), pp. 1-3.
B. Sadoulet, "Cryogenic Detection of Particles, Development Effort in the United States", and F. v. Feilitzsch, T. Hertrich, H. Kraus, L. Oberauer, Th. Peterreins, F. Pröbst and W. Seidel, Calorimetric Detectors at Low Temperatures, both in *Low Temperature Detectors for Neutrinos and Dark Matter, Proceedings of a Workshop*, Ringberg Castle, Tegernsee (May 12-13, 1987), K. Pretzl, N. Schmitz and L. Stodolsky, ed., ((Springer-Verlag, Berlin), pp. 86-93 and 94-112.
L. Gonzalez-Mestres and D. Perret-Gallix, "Neutrinos, Dark Matter and Low Temperature Detectors: Introduction; Basic Properties of Suerpheated Superconducting Granules Detectors", in *Low Temperature Detectors for Neutrinos and Dark Matter II, Proceedings of the Second European Workshop on Low Temperature Devices for the Detection of Low Energy Neutrinos and Dark Matter*, LAPP Annecy-Le-Vieux (Haute-Savoie) France, (May 2-6, 1988), L. Gonzalez-Mestres and D. Perret-Gallix, eds., pp. 2-36 and 297-320.
W. Seidel, L. Oberauer and F. v. Feilitzsch, "Feasibility of a Detector for Nuclear Radiation Based on Superconducting Grains", Review of Scientific Instruments, vol. 58, No. 8, (Aug. 1987), pp. 1471-1476; Copyright © 1987 American Institute of Physics.

*Primary Examiner*—Constantine Hannaher
*Attorney, Agent, or Firm*—C. A. Rowley

[57] ABSTRACT

A cryogenic detector comprises an array formed from a plurality of spherical grains made of type I superconducting material arranged in a preselected pattern and each having a preselected size (generally less than about 100 microns in diameter). Also disclosed is a method of making such an array by depositing a film of selected thickness of type I superconducting material on a substrate, etching the film to provide an array formed by a plurality of discrete pixels, melting the pixels under conditions whereby the pixels are transformed into substantially spherical shape, and cooling to freeze the molten pixels into substantially spherical grains.

19 Claims, 4 Drawing Sheets

ARRAY FOR A NUCLEAR RADIATION AND PARTICLE DETECTOR

FIELD OF THE INVENTION

The present invention relates to an array for a cryogenic detector of high-frequency electromagnetic radiation such as X-rays or γ-rays or particles. More particularly the present invention relates to an ordered array of individual substantially spherical grains of a selected size and arrangement in the array and to a method of making the array.

BACKGROUND TO THE INVENTION

Sensors utilizing individual grains suspended in a matrix similar to a colloidal suspension of very small particles are currently being tested for use as cryogenic detectors of high-frequency electromagnetic radiation (e.g. γ-rays and X-rays) and particles (e.g. electrons, neutrinos and weakly interacting massive particles.) These devices generally are composed of grains of a variety of different shapes and sizes with limited order or control of the shapes, sizes and relative spatial relationships of the grains in the matrix other than generally the maximum size of the grains. The shapes may be irregular, the sizes will vary randomly within a range and their disposition within the matrix will be no more ordered than particles in a colloidal dispersion.

Normally the particles or grains in the matrix will not exceed about 100 microns in their largest dimension and will be made from type I superconducting materials.

Such a detector can detect the presence of particles or radiation of sufficient energy, but the sensitivity, efficiency and both the energy and spatial resolution are dependent upon the number of grains, their size and shape, the uniformity of their size and shape and their distribution in space. The accurate preselection of all of these parameters in a detector has not been achieved and probably cannot be achieved using the conventional prior art teachings. A "figure-of-merit" for efficiency is the fractional spread $F_s$ in the individual superheated superconducting-to-normal transition temperatures in a given magnetic field;

$$F_s = (\Delta T_c / T_c) \quad (1)$$

The prior art figure $F_s$ for tin grains, for example $F_s = 6\%$ approximately for a magnetic field of 0.01 Telsa (T).

Other detectors are described for example in a book titled "Low Temperature Detectors for Neutrinos and Dark Matter" edited by K. Pretzl, N. Schmitz and L. Stodolsky, Springer Verlag 1987.

Another example of a detector using a wire grid detector system is described in U.S. Pat. No. 4,135,091 issued Jan. 16, 1979 to Lanza et al.

BRIEF DESCRIPTION OF THE PRESENT INVENTION

It is an object of the present invention to provide an array for a cryogenic radiation and particle detector having improved characteristics and to a method of making such an array.

Broadly the present invention comprises a detector array for a cryogenic detector formed by a plurality of substantially spherical grains of type I superconducting material arranged in a preselected pattern and each of said grains having a predetermined size less than 100 microns in diameter.

Preferably a plurality of said detector arrays will be combined to form a detector.

Preferable all of said grains will have substantially the same diameter.

Preferably the type I superconducting material will have a critical temperature not exceeding 10 Kelvin (K) and a melting point of less than 1000° C., and more preferably less than 500° C.

The present invention also relates to a method of making an array comprising depositing a substantially continuous film layer of type I superconducting material on a substrate, removing a portion of said film to leave a plurality of discrete pixels each of a predetermined size of said type I superconducting material arranged in a predetermined array, heating said pixels to melt said pixels and under conditions to cause same to assume a substantially spherical shape and cooling said molten pixels to form substantially discrete spherical grains of said superconducting materia arranged in said predetermined array.

Preferably said conditions will comprise applying a flux to said superconducting material before heating, said flux modifying the properties of the surfaces of said superconducting material of said pixels to permit surface tension in said molten superconducting material to form each said pixels into a molten sphere.

BRIEF DESCRIPTION OF THE DRAWINGS

Further features, obJects and advantages will be evident from the following detailed description of the preferred embodiments of the present invention in conJunction with the accompanying drawings, in which.

DESCRIPTION OF THE PREFERRED EMBODIMENTS

Figure 1:
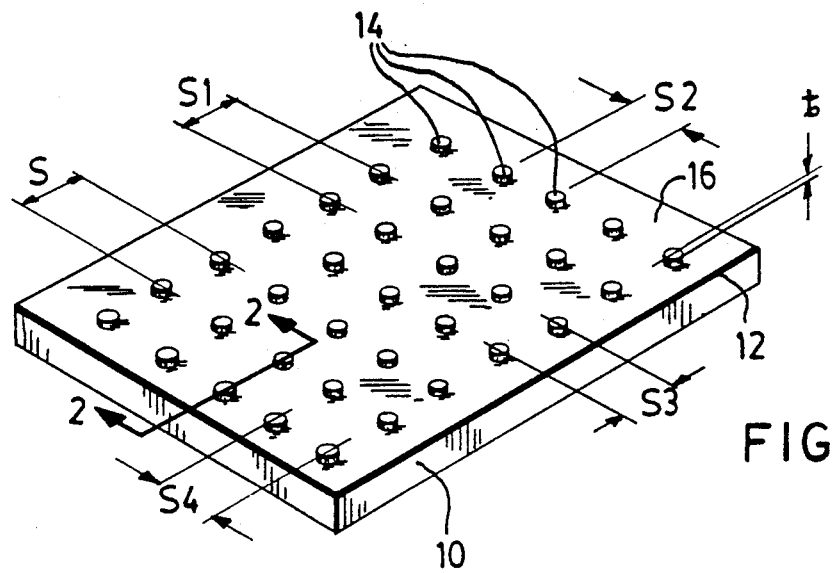
FIG. 1 is an isometric view illustrating the first steps in forming the array of the present invention.
Figure 2:
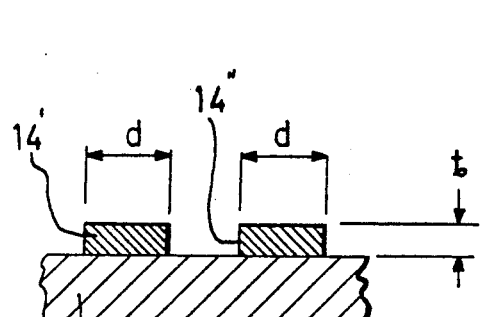
FIG. 2 is a section along the lines 2—2 of FIG. 1 after removal of material to leave only the pixels.

In FIG. 1 a substrate 10 has been covered by a film of 12 having a thickness t (in the illustration thickness t is substantially over the total area of the film layer 12 ) Circular pixels 14 (in the example illustrated the pixels 14 are arranged in 5 horizontal and 7 vertical rows) are formed by removing the material therebetween of film layer 12 i.e. remove the material 16 which in the illustration form a substantially continuous phase between the pixels 14 to leave only the pixels 14 as shown for example in FIG. 2. Any suitable technique may be used for removing the continuous phase 16, but preferably photo-lithography will be used to define the pixels 14 and a reactive ion or chemical etching of the extra superconducting film, i.e. the continuous phase 16, will be used to remove this continuous phase and leave only the pixels 14.

The substrate 10 may be any suitable inert substance, it being important that the individual pixels 14, when heated to melt the superconductor material and form the spherical grains as will be described herebelow, do not adhere to or flow along the surface of the substrate to interfere with the development of the spherical grains from the pixels.

The specific dimensions of each of the pixels and the pattern in which they are arranged are important as they determine the size and position of the grains produced and the size, shape and arrangement of the grains play a significant role in determining the effectiveness of the sensor.

As illustrated in FIG. 2 because of the process used the diameter of each pixel may be selected as desired. For example the diameter $d'$ of pixel 14' in FIG. 2 may be any suitable selected dimension while the diameter $d''$ of the pixel 14'' in FIG. 2 preferably will be the same as $d'$ i.e $d' = d''$, but may, if desired, be any other suitable selected dimension. Normally, as above indicated unless special characteristics are desired all the pixels in an array will have the same diameter. However, in special application selected pixels may have different sizes.

Also the spacing between pixels 14 illustrated in FIG. 1 i.e. between any pair of adjacent pixels 14 such as the spacings illustrated as S, $S_1$, $S_2$, $S_3$ and $S_4$ may all be varied as desired and thereby change the relative positions of the pixels 14 and thus of the spherical grains to be described below in the array. Normally these dimensions S, $S_1$, $S_2$, $S_3$ and $S_4$ etc. will be equal i.e. all have essentially the same value.

The thickness t of the film layer 12 contributes to the final diameter of the grains formed from each pixel since this will be determined by the volume of each discrete pixel.

Normally the thickness t for forming any given array will be substantially uniform, however if desired selected portions of the film could be made thicker than other portions which could be used in combination with diameter of the pixels to control the size of the resulting spherical grain.

The thickness and diameter of individual pixels due to the process of manufacture determine the individual grain size and the spacing of the pixels determines the relative positions of the grains in the array.

The material used to form the film layer 12 and thus the pixels 14 will normally be a Type I superconductor and in most cases be very pure, better than 99.9% purity. However if desired the material may be a Type I superconducting alloy. The superconducting material will be selected to obtain the desired properties for the radiation or particles to be detected. The transition temperature for the superconducting material will normally be less than 10K which includes elements as aluminum, gallium, indium, lead, mercury and tin. If greater sensitivity is desired a type I superconducting material having a critical temperature of no greater than 1K such as cadmium, zinc, iridium and tungsten should be considered. The later two materials have high melting points greater than 1000° C., but very low transition temperatures and thus will require special considerations for manufacture of the grains, but, if obtained, should permit greater sensitivity. Generally for manufacturing grains using the present invention the superconducting material will have a lower melting point of up to 1000° C. preferably no higher than 500° C.

The preferred technique for applying the film 12 to the substrate 10 is by evaporation or sputtering techniques to form the relatively thin thickness t which normally will be less than about 50 microns.

Figure 3:
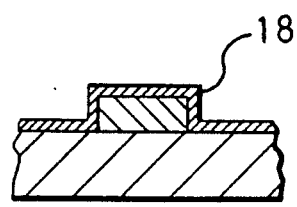
FIG. 3 is a section similar to FIG. 2 but showing a single pixel coated with a flux.
Figure 4:
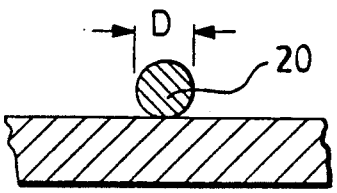
FIG. 4 is a section through a single grain formed from a pixel in accordance with the present invention.
Figure 5:
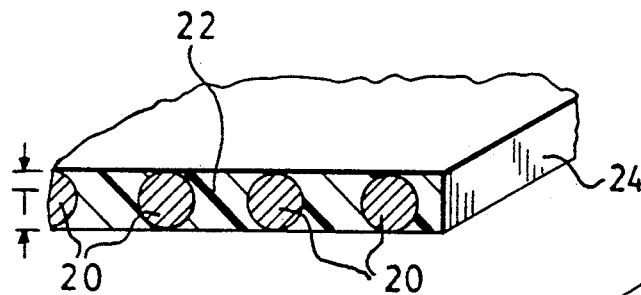
FIG. 5 shows an array embedded in a matrix to form a disk or sheet.
Figure 6:
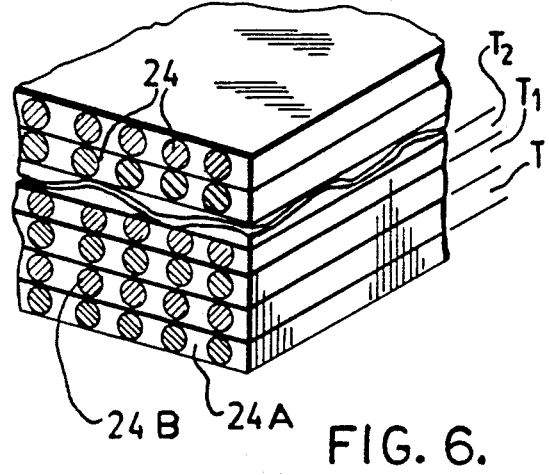
FIG. 6 shows a plurality of disks arranged in stacked relationship to form a detector of the desired size.

In most cases after the pixels 14 have been formed as illustrated in FIG. 2 the pixels and normally the exposed surface of the substrate 10 are coated with a suitable flux or wetting agent 18 (see FIG. 3) to modify the properties of the superconducting material forming the surface of the pixels 12 allowing the surface tension of the molten superconducting material to form each of the pixels 14 into a sphere as shown at 20 in FIG. 4 and 5. The type of flux used is matched to the material forming the pixels and for elements such as tin and indium organic acid or rosin fluxes, which activate when liquid, are very suitable. For some materials, particularly those with high melting points, reduction in the gaseous phase, e.g. hydrogen may be a better way to prevent a surface oxide layer from interfering with grain formation.

The grains 20 shown in FIGS. 4 and 5, which are formed from each of the pixels 14 when the molten pixel is cooled to solidify same in spherical shape, will have a diameter D which as above indicated is dependent on diameter d and thickness t of the pixel from which it is made. Generally diameter D will be less than about 100 microns.

These individual grains are positioned on the substrate 10 in the same array as the pixels formed e.g. the array as illustrated in FIG. 1 and may be embedded in a suitable matrix such as the material 22 shown in FIG. 5 to form a structural disk or sheet type arry 24. The matrix material may be any suitable dielectric material including for exmaple suitable resins such as epoxy resin and the like and is used to encase the grains 20 and form the arry 24. The flux material used in the melting process, in some cases, may have a dual function and function both as the flux and as the matrix material.

The disk array 24 has a thickness T which in the illustrated arrangement is essentially the same as the diameter D of the grains 20. However, if desired the grains 20 may be completely embedded within the matrix to a minimum depth as desired.

Generally a sensor of disk arrays 24 are stacked to form a sensor 26 for example by piling a plurality of disks one on the other. The orientation of the various arrays 24 may be controlled as desired for example the adjacent disks 24A and 24B may be oriented at different angles by positioning the disk 24A with the verticla rows described above at a first angle to a datum and with the vertical rows of the adjacent disk 24B at the same or at a different angle to the same datum.

The thicknesses of several of the disks 24 have been indicated by the thicknesses T, $R_1$ and $T_2$ etc. to indicate that though in most cases all the thicknesses will be the same i.e. $T=T_1=T_2$ it is possible to make the sensor with layers of different thickness disk array.

It will be apparent that a wide variety of different structures may be fabricated from the disk arrays to obtain the desired sensing structure compatible with the particular type of detector system used to detect the change in state of the grains 20 and the form and/or number and locations of detectors relative to the sensor may be designed to obtain the desired information from a specific sensor structure.

Figure 7:
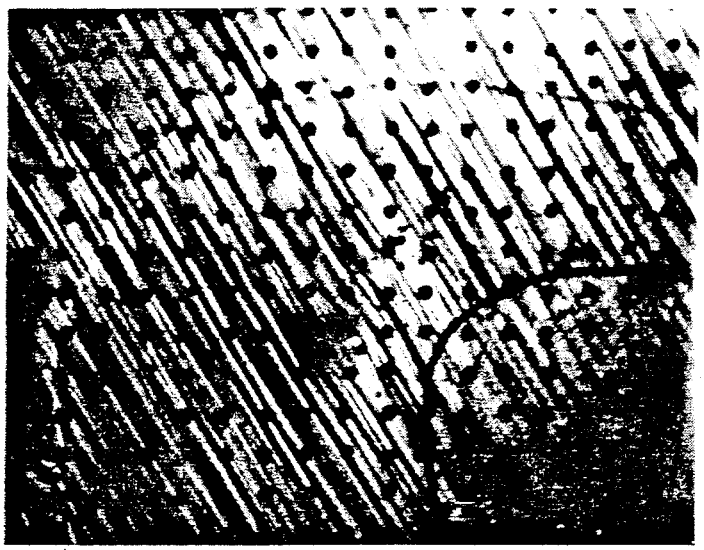
FIG. 7 is a copy of a microphotograph of a portion of an array constructed in accordance with the present invention magnified about 60 times.
Figure 8:
FIGS. 8 and 9 are similar to FIG. 7 but show increased magnifications of namely 240 and 640 respectively.
Figure 9:

Referring to FIGS. 7, 8 and 9 photographs of the actual grains show the size and spherical shape of the individual grains and the arrangement of the grains in an ordered arrangement or array.

In the above description the shape of the pixels has been described as circular i.e. a circular cylindrical structure, but the precise shape need not be circular, though such a shape is preferred. The shape of the pixels could be hexagonal, square with rounded corners for example provided surface tension in th molten pixel can modify the shape to become substantially spherical.

Figure 10:
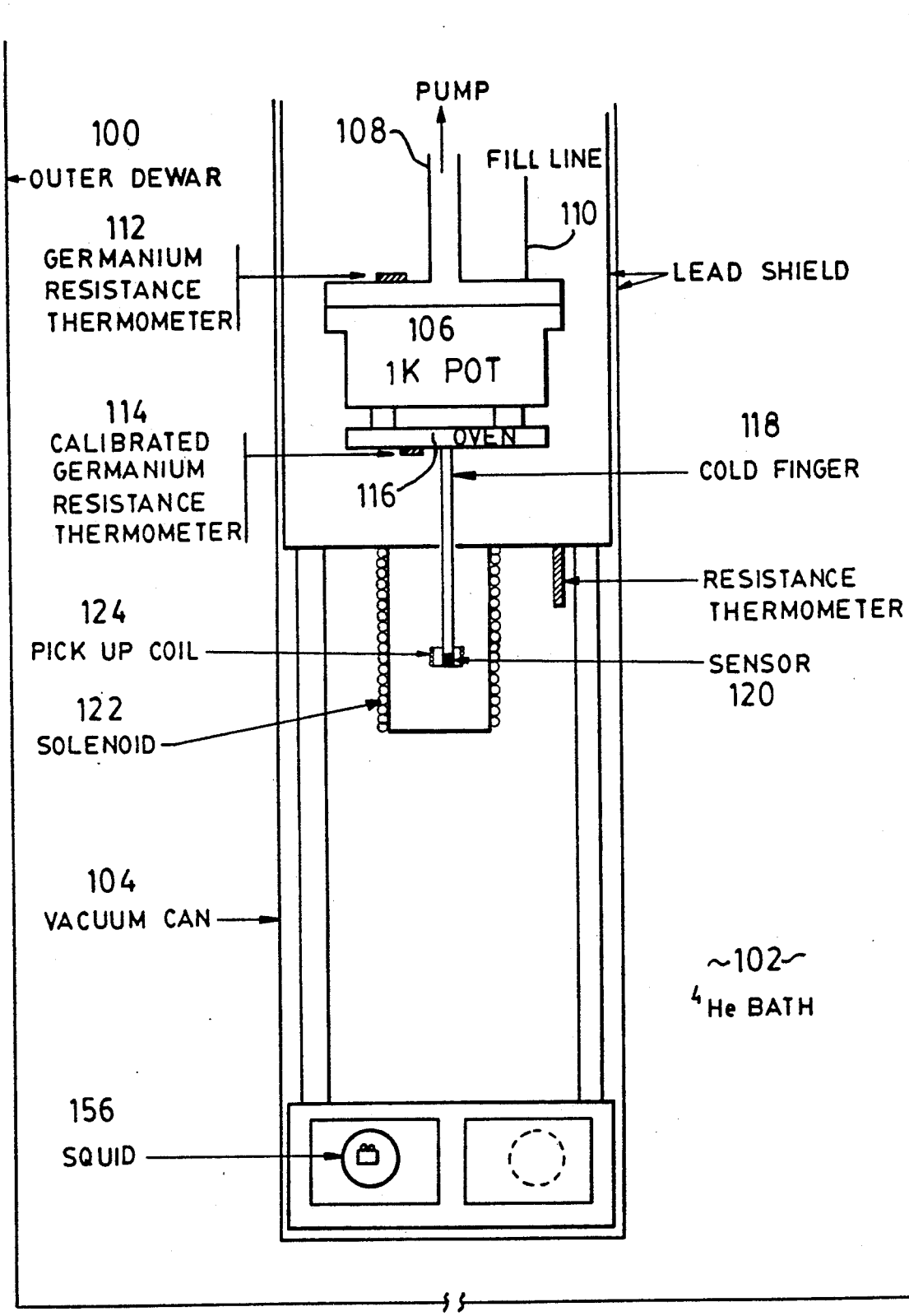
FIG. 10 schematically illustrates a typical arrangement in which a detector constructed in accordance with the present invention has been tested.

FIG. 10 show one application of the sensor of the present invention when used in a particular cryostat arrangement. In the system shown the outer Dewar container 100 is filled with Helium 102 to maintain a bath at the relatively low temperature required (4.2K). Mounted within the vacuum can 104 is a conventional 1K pot 106 connected via line 108 to the conventional vacuum pump (not shown) and having a fill line 110. A suitable germanium thermometer 112 measures the temperature of the pot 106 and a second germanium thermometer 114 measures the temperature of the "oven" 116 which is connected via the cold finger 118 to the sensor 120 which is essential the sensor 24 described hereinabove. The sensor 120 and its associated pick up coil 124 are surrounded by a suitable superconducting solenoid 122 which serves the dual purpose of shielding the sensor 120 and pick up coil 124 from stray fields and producing a predetermined uniform magnetic field on them. The pick up coil 124 is connected to the SQUID system 156 which monitors the change of state of the grains 20.

Figure 11:
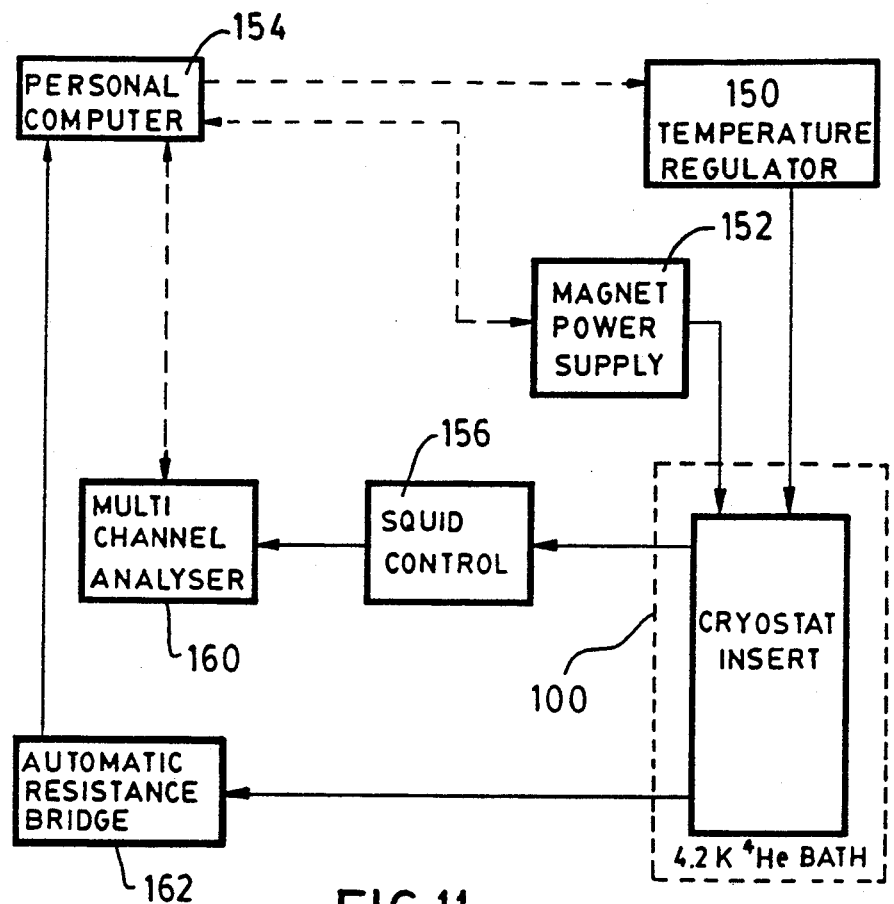
FIG. 11 schematically illustrates a computer system for use with the sensor of the present invention.

FIG. 11 illustrates schematically the electronic system of the present invention. The temperature of the cold finger 118 is controlled by a suitable temperature controller 150 and the current in the solenoid 122 (which determines the magnetic field) is regulated by the magnetic power supply 152. Both the temperature controller 150 and the magnetic power supply 152 are controlled by a suitable computer 154. In the experimental arrangement, the temperature could be controlled to 1 mK (which could be made more accurate if desired) and the magnetic field was held extremely constant when the superconductor solenoid is operating in the persistent current mode.

When grains 20 in the sensor 120 are "flipped" from the superheated superconducting state to the normal state (as occurs when the grains 20 in the superheated superconducting state absorb sufficient energy, obtained for example from bombardment by particles of radiation) there is a resultant magnetic flux change which is detected by the coil 124 and measured by the SQUID system 156. The output of the SQUID 156 is fed to a multichannel analyzer 160 and the information stored in the computer 154.

An automatic resistance bridge 162 forms part of the control circuit used with the controller 150 to control the temperature.

In operation the sensor (equivalent to sensor 26) operates essentially the same as other superheated superconducting cryogenic detectors that incorporate individual grains of superconductor material. The magnetic field on and the temperature of the sensor 120 are adjusted to prepare the grains 20 in a superheated superconducting state just inside the superheated superconducting-to-normal phase boundary. When the incident radiation or particles deposit enough energy in a grain, or grains, to nucleate the superheated superconducting-to-normal phase transition a magnetic flux change occurs which is detected by the pick up coil 124 and measured by the SQUID system 156.

As indicated above, the detection properties (sensitivity, efficiency, energy and spatial resolutions) depend on the regularity of the array and the uniformity of the size and shape of the grains all of which may be can be manipulated when produced using the method of he present invention. For example, a sensor having all the grains essentially the same size and shape and arranged in a selected pattern e.g.a square may be produced. This structure results in a large proportion of the individual grains being at the same temperature and subject to the same local magnetic field and therefore a very significant improvement in the efficiency of the deteotor e.g. approximately an order of magnitude improvement over well known prior art devices of which the Applicant is aware.

EXAMPLE

A planar square array specimen was fabricated from metalized (indium) mylar, and the mylar side was glued with epoxy resin sold under the trade name "Stycast" to the inside of a copper sample holder, shaped as a cup. The cup was then filled with rosin flux sold under the tradename Indalloy Flux #5 which had been rendered solvent-free by evaporation and then powdered. The temperature was raised carefully to 5-10K above the melting point of the superconductor and held there for approximately 1 minute to melt the pixels and form them into spheres. On resolidifying the flux functioned as a binder for the spherical grains on the substrate. A number of indium samples were made with various dimensions.

A first sample was made from a planar array of indium squares of side dimension 36 microns and 5 microns thickness which following the above treatment formed an array of spheres (grains). Measurements on this array yielded a mean grain diameter of 23.3 microns with a standard deviation of 1.8 microns and a mean distance between centres of 81.4 microns with a standeard deviation of 6.0 microns. FIGS. 7, 8 and 9 are copies of photos of the grains in the array produced in this example.

Figure 12:
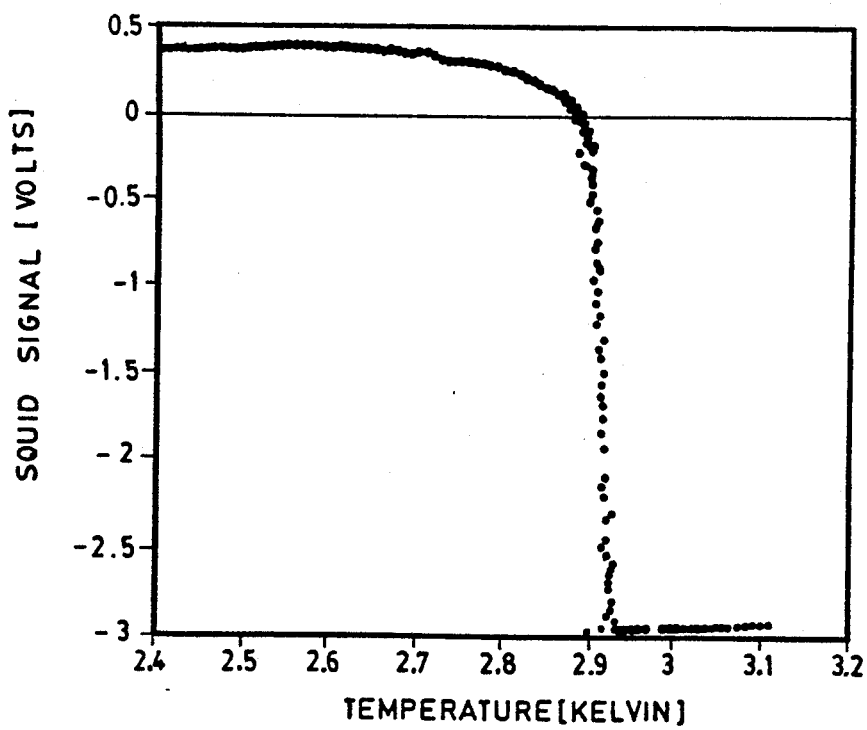
FIG. 12 is a plot of SQUID (Superconducting Quantum Interference Deyice) Signal vs. Temperature (K) showing the very narrow range of transition temperatures obtainable by selecting a specific sensor constructed in accordance with the present invention.

The thus produced array was tested in a field of 0.01 T and as can be seen in FIG. 12, a large fraction of the grains "flipped" from the superheated superconducting state to the normal state over a relatively small temperature range 30 (approximately 20 mK). This corresponds to a figure-of-merit $F_s=0.6\%$ approximately which is an improvement over the prior art by a factor of 10.

The arrays of the present invention have been described in relation to a SQUID type detecting system, however the arrays of the present invention can be suitably modified by the appropriate incorporation of wires to operate with known wired detecting systems such as that generally described in the above referred to U.S. Pat. No. 4,135,091.

The preferred embodiments of the invention are illustrated by way of the examples, but it is to be expr ssly understood that the description and drawings are only for the purpose of illustration and as an aid to understanding and are not intended as a definition of the invention.

Having described the invention modifications will be evident to those skilled in the art without departing from the spirit of the invention as defined in the appended claims.

We claim:

1. A detector array for a cryogenic detector comprising a plurality of substantially spherical grains of type 1 superconducting material with each grain arranged in a preselected pattern in a preselected spatial relationship with other grains in said pattern and withe ach of said grains having a predetermined size of less than 100 microns in diameter.

2. A detector array as defined in claim 1 wherein all of said grains have substantially the same diameter.

3. A detector array as defined in claim 2 wherein said type I superconducting material has a critical temperature not exceeding 10K.

4. A detector array as defined in claim 3 further comprising an inert matrix containing said grains.

5. A detector as defined in claim 3 wherein said array is a planar array.

6. A detector array as defined in claim 2 wherein said array is a planar array.

7. A detector array as defined in claim 1 wherein said array is a planar array.

8. A detector comprising a plurality of superimposed detector arrays, each said detector array comprising a plurality of substantially spherical grains of type I superconducting material with each grain in a preselected pattern in a preselected spatial relationship with other grains in said pattern and with each of said grains having a predetermined size less than 100 microns in diameter and an inert matrix containing said grains.

9. A detector array as defined in claim 8 wherein all of said grains have substantially the same diameter.

10. A detector array as defined in claim 9 wherein said type I superconducting material has a critical temperature not exceeding 10K.

11. A detector as defined in claim 10 wherein said each array is a planar array.

12. A detector as defined in claim 9 wherein said each array is a planar array.

13. A detector as defined in claim 8 wherein said each array is a planar array.

14. A method of making a detector array comprising depositing a substantially continuous film layer of type I superconducting material on a substrate removing a portion of said film to leave a plurality of discrete pixels each of a predetermined size of said type I superconducting material arranged in a predetermined array, heating said pixels to melt said pixels under conditions to cause said pixels to assume a substnatially spherical shape and cooling said molten pixels to form substantially discrete spherical grains of said superconducting material arranged in said predetermined array with each grain in a preselected spatial relationship to other grains in said array.

15. A method as defined in claim 14 wherein said conditions comprise applying a flux to said superconducting material before heating, said flux modifying the properties of the surfaces said superconducting material of said pixels to permit surface tension in said molten superconducting material to form said pixels into a molten spheres.

16. A method as defined in claim 15 further comprising encasing said array of grains in an inert matrix.

17. A method as defined in claim 16 wherein said substrate has a planar surface and wherein a film layer is deposited on said planar surface to produce a planar array.

18. A method as defined in claim 15 wherein said substrate has a planar surface and wherein a film layer is deposited on said planar surface to produce a planar array.

19. A method as defined in claim 14 wherein said substrate has a planar surface and wherein a film layer is deposited on said planar surface to produce a planar array.

* * * * *